Jan. 23, 1951

D. E. NOBLE 2,539,268

OSCILLATOR

Filed April 25, 1945

INVENTOR.
DANIEL E. NOBLE
BY Mueller, Dodds + Mason
ATTORNEYS

Patented Jan. 23, 1951 2,539,268

UNITED STATES PATENT OFFICE 2,539,268

OSCILLATOR

Daniel E. Noble, Elmhurst, Ill., assignor to Motorola, Inc., a corporation of Illinois Application April 25, 1945, Serial No. 590,197

2 Claims. (Cl. 250—36)

Figures 1, 2:
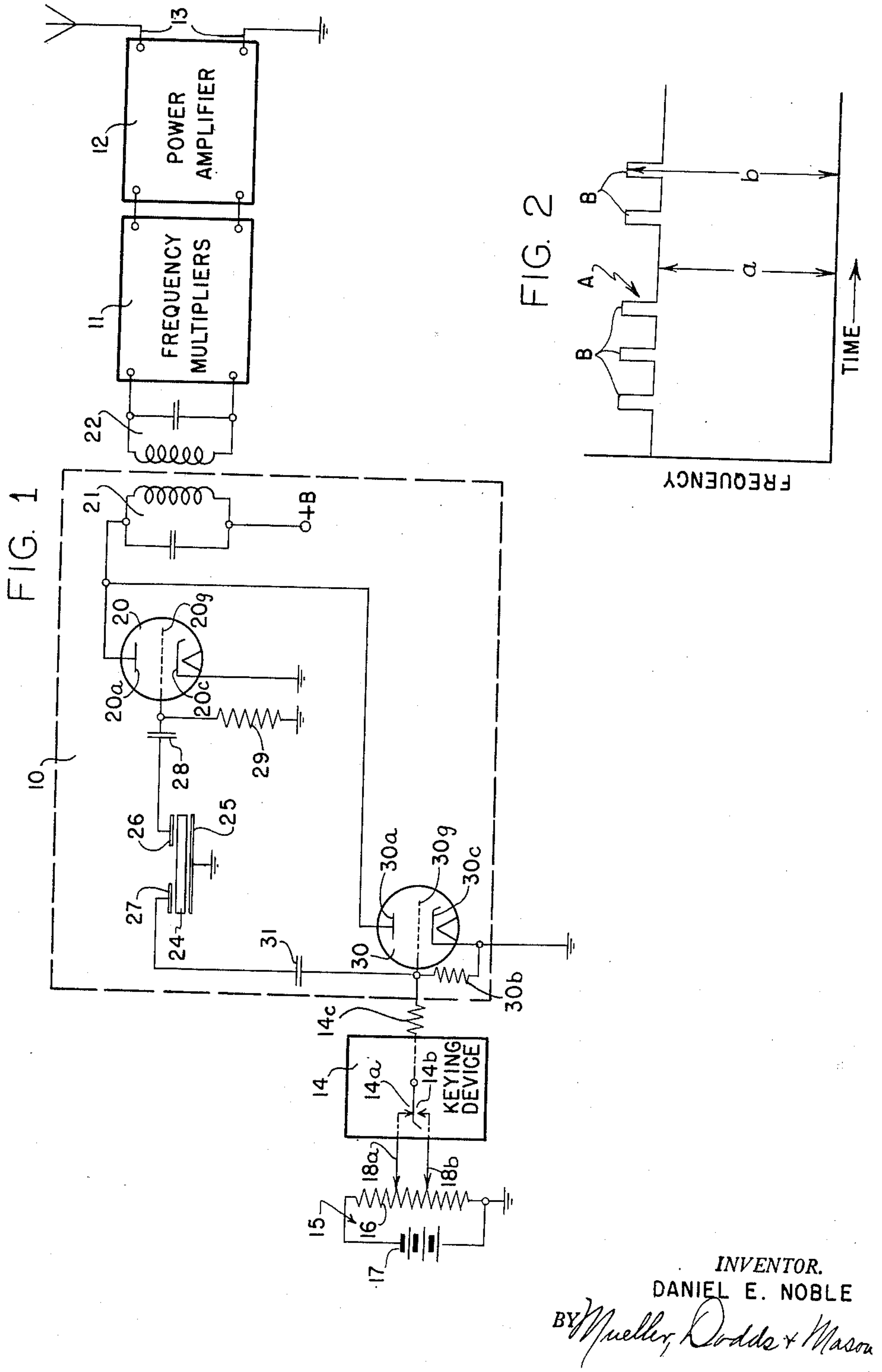

The present invention relates to electronic oscillators and more particularly to improvements in crystal controlled oscillators.

Crystal controlled oscillators of the type employing piezoelectric crystals as the frequency determining element are widely used in high frequency communication systems, and particularly in wave signal transmitters, where stability of the oscillator output frequency is important. The lack of acceptable facilities for adjusting the output frequency of such oscillators has, however, prevented their use in applications where controlled changes in oscillator output frequency are required.

It is an object of the present invention, therefore, to provide an improved oscillator of the crystal controlled type having an output frequency which may be easily adjusted between two or more values.

It is another object of the invention to provide improved and exceedingly simple facilities for changing the output frequency of a crystal controlled oscillator.

It is a further object of the invention to provide an improved transmission system for generating signal modulated waves.

In brief, the above objects are attained in accordance with the present invention by providing a crystal controlled oscillator comprising a frequency determining piezoelectric crystal having electrode means associated therewith, and electronic control means coupled to said crystal electrode means for controlling the crystal mode of vibration to change the output frequency of the oscillator.

The invention, both as to its organization and method of operation, together with further objects and advantages thereof, will best be understood by reference to the following specification taken in connection with the accompanying drawing, in which:

Fig. 1 illustrates a radio transmission system having embodied therein a crystal controlled oscillator characterized by the features of the present invention; and Fig. 2 is a graph illustrating the mode of operation of the oscillator.

Referring now to the drawing, and more particularly to Fig. 1 thereof, the present improved crystal controlled oscillator is there illustrated in its embodiment in a radio transmitter of the type wherein pulse modulation of the generated signal carrier is used for intelligence transmission. In brief, the system comprises the present improved crystal controlled carrier producing oscillator 10, a plurality of frequency multipliers 11 and a power amplifier 12 connected in tandem in the order named and arranged to deliver the generated output energy to an antenna ground circuit 13. For the purpose of changing the output frequency of the oscillator 10 on a pulse basis and in accordance with the code system of intelligence utilized in transmission, a keying device 14 is provided which may be of any conventional construction. This device is utilized directly to control the magnitude of the bias voltage derived from a biasing circuit 15 and impressed between the input electrodes of the frequency control tube of the oscillator 10 through an isolating resistor 14c. Specifically, the biasing circuit 15 is comprised of a biasing current source 17 bridged by a voltage dividing resistor 18 along which taps 18a and 18b may be adjustably positioned. In accordance with conventional practice, the keying device 14 is provided with two sets of contacts 14a and 14b through which the bias potentials respectively appearing upon the taps 18a and 18b may be applied to the input grid of the oscillator control tube.

Briefly, the oscillator 10 comprises the usual electron discharge tube 20 having a tuned output circuit 21 through which the generated signal carrier energy is transferred to the tuned input circuit 22 of the first frequency multiplier 11. This tube is also provided with input electrodes 20c and 20g to which the frequency determining piezoelectric crystal 24 is coupled through the usual grid leak condenser arrangement comprising a condenser 28 and resistor 29. Specifically, the lower electrode 25 associated with the crystal 24 is connected directly to the cathode 20c of the tube 20, whereas the upper electrode 26 is coupled to the grid 20g of the tube 20 through the grid leak condenser 28.

In accordance with the present invention, the crystal 24 also has associated therewith an auxiliary electrode 27 which, in cooperation with an electronic control tube 30 of the triode type, is arranged to control the output frequency of the oscillator. More specifically, the output electrodes 30a and 30c of the control tube 30 are bridged directly across the output circuit 21 of the oscillator, and the input electrodes 30g and 30c of the tube are shunted by a leak resistor 30b and are coupled across the electrodes 27 and 25 of the crystal through a coupling condenser 31.

With the described circuit arrangement of the oscillator 10, the crystal 24 is characterized by different frequency modes of vibration depending upon whether one or both of the two upper electrodes 26 and 27 are active in the circuit. Thus, it has been found that the mode of vibration of a piezoelectric quartz crystal of the character indicated at 24 is dependent upon several factors, including the capacitance between the associated electrodes and the crystal faces, and the portion of each crystal face area which is covered by the associated electrode. In the illustrated arrangement, the crystal 24 is characterized by one mode of vibration to effect the production of a given oscillator output frequency when the electrode 26 is alone active in the circuit, and is characterized by a different mode of frequency vibration to produce a different oscillator output frequency when the two electrodes 26 and 27 are jointly active in the circuit. It will be apparent, therefore, that by selectively rendering the electrode 27 active and inactive in the circuit in accordance with any desired code pattern, the output freqency of the oscillator 10 may be changed to correspondingly pulse modulate the oscillator output. Further, the crystal face areas respectively covered by the electrodes 26 and 27 are preferably so proportioned that the frequency which is produced in response to activation of the electrode 27 provides for the desired degree of modulation without exceeding the limits of the frequency band which the circuits 21 and 22 are designed to pass. In other words, the tuned output circuit 21 of the oscillator is preferably sufficiently broadly tuned to embrace the output frequency of the oscillator both when the electrode 27 is active and inactive. In this regard it will be understood that the frequency of the generated signal voltage appearing at the output side of the oscillator 10 is multiplied two or more times during transmission through the multiplier stages 11, and that the voltage appearing at the output side of the multiplier stages is amplified by the power amplifier 12 and delivered to the antenna-ground circuit 13 for radiation.

As indicated above, the control tube 30 is provided for the purpose of selectively rendering the auxiliary electrode 27 active and inactive in the oscillator circuit under the control of the keying device 14. More specifically, when this tube is biased beyond cutoff by the negative voltage applied between the electrodes 30*c* and 30*g* thereof through the contacts 14*a* of the keying device 14, no space current flows in this tube and hence the auxiliary electrode 27 is rendered completely ineffective to determine the output frequency of the oscillator 10. Under these circumstances the output frequency of the oscillator may be represented by the value *a* along the frequency-time graph A shown in Fig. 2 of the drawing. When, however, the keying device 14 operates to switch the grid 30*g* of the control tube 30 from a connection with the voltage divider tap 18*a* to a connection through the contacts 14*b* with the voltage divider tap 18*b*, the bias impressed between the input electrodes of the tube 30 is reduced to a normal value to permit space current flow through the tube and thereby electronically couple the auxiliary crystal electrode 27 with the output circuit of the oscillator. As a result, the active area of the electrodes associated with the crystal 24 is increased, causing the crystal to change its mode of vibration to a higher value. Thus, the electrode 27, when actively included in the oscillator circuit, produces an increase in the vibratory frequency of the crystal 24 and hence an increase in the output frequency of the oscillator. As shown by the graph A, illustrated in Fig. 2 of the drawing, this increase in the oscillator output frequency may be from the normal value *a* to the value *b*. It will be apparent, therefore, that as the bias impressed between the input electrodes 30*c* and 30*g* of the tube 30 is changed back and forth between the described normal and cutoff values under the control of the keying device 14, a signal is produced at the output side of the oscillator 10 which is pulse modulated as indicated by the pulses B of the frequency-time curve A. The pulse pattern is, of course, determined by the pattern of the code utilized in controlling the operation of the keying device 14 and may be of any desired form useful in the transmission of facsimile, for selective receiver calling purposes, or other similar applications.

While there has been described what is at present considered to be the preferred embodiment of the invention, it will be understood that various modifications may be made therein which are within the true spirit and scope of the invention as defined in the appended claims.

I claim:

1. A crystal controlled oscillator comprising an electron discharge tube having input electrodes and a tuned output circuit, a frequency determining piezoelectric crystal having electrodes coupled to the input electrodes of said tube to determine the output frequency of said oscillator, said piezoelectric crystal including an auxiliary electrode, an electron discharge tube having output electrodes coupled to said output circuit and input electrodes coupled to said auxiliary electrode, the output frequency of said oscillator being changed in response to a change in the bias between the input electrodes of said last-named tube by rendering said auxiliary electrode effective, or ineffective, and means for changing the bias between said last-named input electrodes.

2. A wave signal transmission system comprising an oscillator provided with a frequency determining piezoelectric crystal having three electrodes, said oscillator including an electron discharge tube having input electrodes connected to two of said three electrodes and a tuned output circuit, electronic control means connected to the third of said three electrodes and to said tuned output circuit to change the frequency of vibration of said crystal in dependence upon whether said electronic control means is rendered effective, selective means for controlling the effectiveness of said electronic control means whereby said crystal operates at one frequency when said third electrode is rendered ineffective and at another frequency when said electronic control means is operated so as to render said third electrode effective.

DANIEL E. NOBLE.

REFERENCES CITED

The following references are of record in the file of this patent:

UNITED STATES PATENTS

| Number | Name | Date |
|---|---|---|
| 1,735,344 | White | Nov. 12, 1929 |
| 1,788,239 | Hund | Jan. 6, 1931 |
| 1,872,379 | Wolf | Aug. 16, 1932 |
| 2,000,584 | Fichandler | May 7, 1935 |
| 2,067,081 | Goldstine | Jan. 5, 1937 |
| 2,106,821 | Tunick | Feb. 1, 1938 |
| 2,274,486 | Koch | Feb. 24, 1942 |
| 2,424,246 | Mason | July 22, 1947 |